United States Patent [19]

Tanaka et al.

[11] Patent Number: 5,226,052
[45] Date of Patent: Jul. 6, 1993

[54] LASER DIODE SYSTEM FOR CUTTING OFF THE ENVIRONMENT FROM THE LASER DIODE

[75] Inventors: Haruo Tanaka; Naotaro Nakata, both of Kyoto, Japan

[73] Assignee: Rohm, Ltd., Kyoto, Japan

[21] Appl. No.: 946,022

[22] Filed: Sep. 10, 1992

Related U.S. Application Data

[63] Continuation of Ser. No. 696,084, May 6, 1991, abandoned.

[30] Foreign Application Priority Data

May 8, 1990 [JP] Japan ................................. 2-119586
May 14, 1990 [JP] Japan ................................. 2-123587

[51] Int. Cl.$^5$ ............................ H01S 3/04; H01S 3/19
[52] U.S. Cl. ................................. 372/36; 257/82; 257/100; 372/109
[58] Field of Search ................. 372/49, 36, 109; 257/80, 81, 82, 98, 99, 100

[56] References Cited

U.S. PATENT DOCUMENTS

| 4,550,333 | 10/1985 | Ridder | 372/36 |
| 4,733,067 | 3/1988 | Oinoue et al. | 357/19 |
| 4,745,294 | 5/1988 | Kohashi et al. | 357/19 |
| 5,068,866 | 11/1991 | Wada et al. | 372/36 |

FOREIGN PATENT DOCUMENTS

| 0140190 | 6/1986 | Japan | 372/49 |
| 125688 | 5/1990 | Japan | 372/3 G |

Primary Examiner—James W. Davie

[57] ABSTRACT

A laser diode, which includes a substrate, a laser diode chip bonded on the substrate through a sub-mount, and a monitor element formed on the substrate, monitors laser light emitted from a rear cleavage face of the laser diode chip. The laser diode chip has its front cleavage face covered by a transparent resin. As a result, variations of the surface state of the front cleavage face are prevented.

4 Claims, 5 Drawing Sheets

LASER DIODE SYSTEM FOR CUTTING OFF THE ENVIRONMENT FROM THE LASER DIODE

This application is a continuation of application Ser. No. 07/696,084 filed on May 6, 1991, now abandoned.

BACKGROUND OF THE INVENTION

The present invention generally relates to a diode unit, and more particularly, to a laser diode for use in an electrical or electronic equipment.

Conventionally, in the field of laser diodes, there have been employed a so-called can-seal type and a unit type. As shown in cross sectional views of FIGS. 8 and 9, an example of a known unit type laser diode 41 is shown which generally includes a substrate 42, and a laser diode chip 49 die-bonded on the substrate 42 through a sub-mount 43, with a photodiode being incorporated in the sub-mount 43 as a monitor element 47.

The monitor element 47 referred to above is arranged to receive laser light emitted from a rear cleavage face 49b of the laser diode chip 49. Based on the light receiving current (i.e. monitor current) of the monitor element 47, driving current for the laser diode chip 49 is controlled by an APC (automatic phase control) circuit so as to allow laser light of the laser diode chip 49 to reach a predetermined value.

On the sub-mount 43, aluminum wirings 45 and 46 connected to the laser diode chip 49 and the monitor chip 47 are formed so as to be bonded to leads 54a and 54b on the flexible circuit 54 by wires W.

In the conventional laser diode 41 as described above, because a front cleavage face 49a of the laser diode chip 49 has a problem of flatness, the characteristics of the laser beam emitted from the front cleavage face 49a may be adversely affected.

Another disadvantage of the conventional laser diode is that, when the laser diode 41 is formed into an open construction without covering, the front cleavage face 49a is exposed to atmosphere and the state of its surface is altered by moisture in the air. As a result, the convention laser diode is inferior in resistance against the environment. In the case of the laser diode of the can-seal type, such a problem does not readily take place because the laser diode is sealed. However, another problem exists that a sufficient size reduction is difficult to be achieved.

SUMMARY OF THE INVENTION

Accordingly, an essential object of the present invention is to provide a laser diode which is capable of achieving a sufficient resistance against the environment with a flatness of a cleavage face of the diode chip.

Another object of the present invention is to provide a laser diode of the above described type which is simple in construction, stable in functioning, and can be readily manufactured on a large scale at low cost.

In accomplishing these and other objects, according to one preferred embodiment of the present invention, there is provided a laser diode comprising substrate, a laser diode chip bonded on the substrate through a sub-mount, and a monitor element formed oh said substrate so as to monitor laser light emitted from a rear cleavage face of the laser diode chip. The laser diode chip has its front cleavage face, covered by a transparent resin.

The transparent resin referred to above is prepared by applying a transparent resin material in a liquid state over the front cleavage face for subsequent hardening. Upon application of the liquid state transparent resin material thereover, the surface of said liquid state resin material becomes flat by a surface tension to cover said front cleavage face, with such a state being maintained even after the hardening thereof.

Since the front cleavage face is covered by the transparent resin to be cut off from the atmosphere, it becomes possible to prevent the variation of the surface state of said front cleavage face, especially due to humidity.

In another aspect of the present invention, the laser diode includes a substrate, a laser diode chip bonded on the substrate through a sub-mount, and a monitor element formed on said substrate so as to monitor laser light emitted. . from a rear cleavage face of said laser diode chip. The laser diode is characterized in that there is further provided a transparent member disposed before a front cleavage face of the laser diode chip, with a transparent resin being filled in a space between said front cleavage face and said transparent member.

In the above arrangement of the present invention, the transparent member closely adheres, through the transparent resin, onto the front cleavage face of the laser diode chip, and the laser beam is to be irradiated or projected from said transparent member. If the irradiating face of the transparent member is processed to be flat, a similar effect as in the flattening of the front cleavage face of the laser diode chip may be achieved for improvement of the beam characteristics, etc. as well as the effect available from the arrangement in the first embodiment.

BRIEF DESCRIPTION OF THE DRAWINGS

These and other objects and features of the present invention will become apparent from the following description taken in conjunction, with the preferred embodiment thereof with reference to the accompanying drawings, in which.

DETAILED DESCRIPTION OF THE PREFERRED EMBODIMENTS OF THE PRESENT INVENTION

Figure 1:
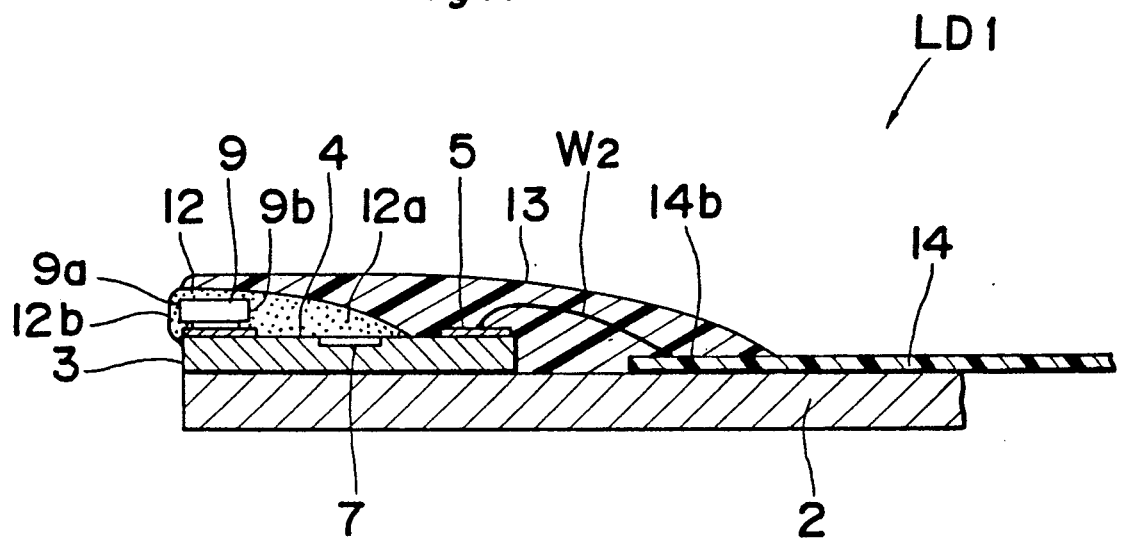
FIG. 1 is a side sectional view of a laser diode according to one preferred embodiment of the present invention.

Before the description of the present invention proceeds, it is to be noted that like parts are designated by like reference numerals throughout the accompanying drawings.

Figure 2:
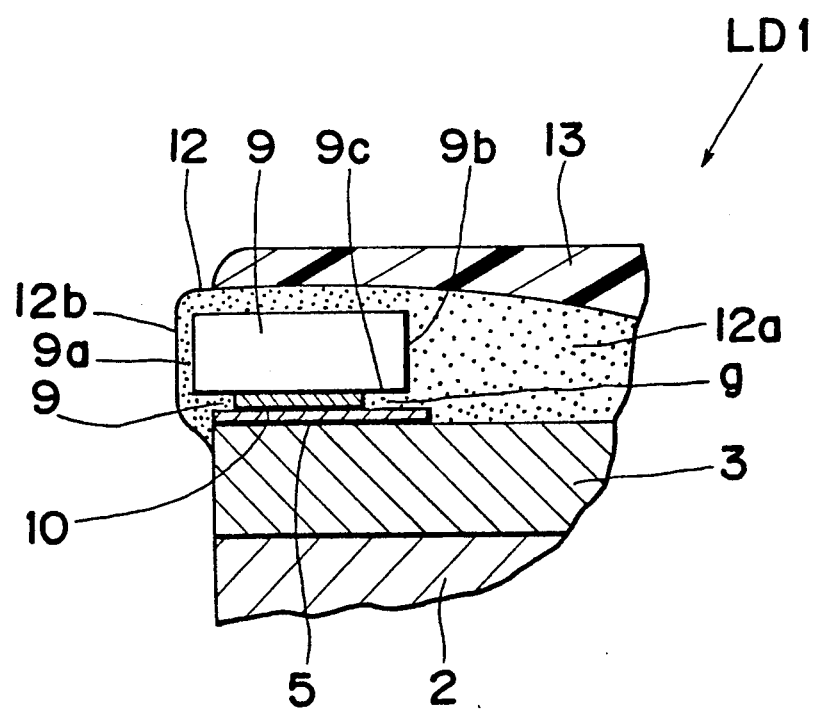
FIG. 2 is a fragmentary side sectional view of the laser diode of FIG. 1.
Figure 3:
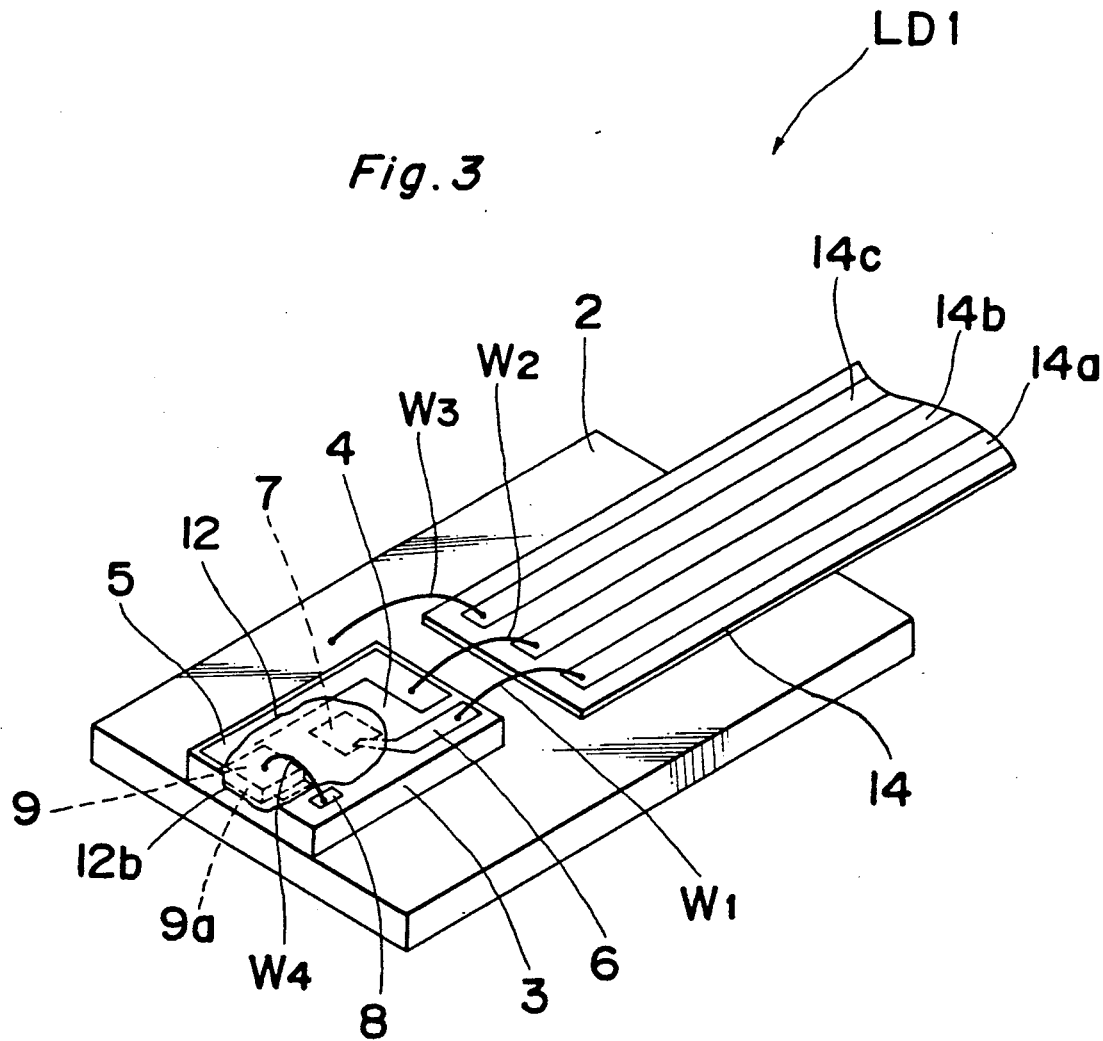
FIG. 3 is a perspective view of the laser diode in FIG. 1, with a protective resin thereof removed for clarity.

Referring now to the drawings, there is shown in FIGS. 1 to 3, a laser diode LD1 according to one preferred embodiment of the present invention.

The laser diode LD1 of a so-called unit type generally includes a substrate or a base 2, a laser diode chip 9 bonded on the substrate 2 through a sub-mount 3, and a monitor element 7 formed on the sub-mount 3.

The substrate 2 is prepared by applying nickel plating and gold plating over the surface of an aluminum plate. At a central portion on the forward portion (left side in FIGS. 1 to 3) of the substrate 2, the sub-mount 3 is fixedly disposed by a connecting material such as indium, or the like. The sub-mount 3 fundamentally including a rectangular plate material of silicon is formed with an aluminum wiring 5 for supplying power to the laser diode chip 9 and another aluminum wiring 6 for deriving electric current produced on the sub-mount 3 by the action of the monitor element 7 to be described more in detail later, on its surface through a silicon dioxide film 4 provided over the surface of the sub-mount 3.

Towards a forward end central portion of the sub-mount 3, the aluminum wiring 5 extends to form a bonding surface, on which the laser diode chip 9 is bonded by an electrically conductive brazing material 10. In the above case, two cleavage faces 9a and 9b of the laser diode chip 9 are respectively directed towards the front and rear sides of the sub-mount 3.

As is also shown in FIG. 2, the electrically conducive brazing material 10 does not cause an entire bottom face 9c of the laser diode chip 9 to fixedly adhere to the bonding surface, but is adapted to leave gaps g.

Meanwhile, at the central portion on the surface of the sub-mount 3, i.e. at a region adjacent to the rear cleavage face 9b of the laser diode chip 9, a photo-diode element, which functions as the monitor element 7, is integrally formed in the sub-mount 3 by a PN junction through diffusion of a P type impurity from the surface of the sub-mount 3. The monitor element 7 is associated with the aluminum wiring 6.

The aluminum wirings 5 and 6 are respectively bonded to corresponding leads 14a and 14b or a flexible circuit 14 connected onto the substrate 2 by wires W1 and W2, while a negative electrode of the laser diode chip 9 is bonded by a wire W4, to a pad 8 conducted inside by partly cutting open the silicon dioxide film 4 on the sub-mount 3, and is thus electrically conducted to the substrate 2. The substrate 2 is further bonded to a lead 14c of the flexible circuit 14 by a wire W3.

The laser diode chip 9 is covered by a transparent resin 12. This transparent resin 12 not only covers the front cleavage face 9a but extends also behind the laser diode chip 9 for connecting a solid state waveguide 12a to the rear cleavage face 9b and the monitor element 7.

For the transparent resin 12, epoxy resin, silicon resin, etc. are employed, which are applied to the laser diode chip 9 in a liquid state. This liquid state resin forms a flat face on the forward cleavage face 9a by its surface tension, and also fills the gaps g between the bottom face 9c of the laser diode chip 9c and the upper face of the sub-mount 3 through capillary action.

When the resin is hardened in the above state, it maintains the flatness on its surface even after the hardening, thus forming a flat irradiating surface 12b. Moreover, the entire laser diode chip 9 is sealed by the transparent resin 12.

On the substrate 2, a protective resin layer 13 is further formed so as to cover the sub-mount 3, and wires W1 to W4, etc. for protection. Accordingly, the laser diode LD1 may be directly handled by fingers, or tweezers.

According to the laser diode LD1 of the present embodiment as described so far, the laser beam emitted from the front cleavage face 9a is irradiated forward from the flat irradiating surface 12b of the transparent resin 12.

Meanwhile, the light irradiated from the rear cleavage face 9b proceeds through the solid state waveguide 12a, and is reflected at a boundary face between the transparent resin 12 and the protective resin layer 13 so as to be received by the monitor element 7.

It is to be noted here that, if the protective resin layer 13 is formed by a transparent resin, with a white pigment, titanium oxide or the like dispersed therein, the light transmitted out of the solid state waveguide 12a is subjected to scattering and reflecting within the protective resin layer 13, and again, returns into the solid state waveguide 12a to be received by the monitor element. Thereby the light amount received by the monitor element 7 is further increased.

On the other hand, because the laser diode chip 9 is sealed by the transparent resin 12, the laser diode chip 9 is cut off from the atmosphere. Thus, variations of the surface states of the cleavage faces 9a and 9b, the bottom face 9c, etc. by the atmosphere, especially by humidity, etc. can be prevented. Accordingly, superior resistance to the environment, especially resistance against humidity, which is not inferior to the resistance of the can-seal type laser diode, may be imparted to the laser diode of the unit type.

In the conventional laser diode of the can-seal type, although the diameter thereof was about 5.6 mm at a minimum, it is possible, in the laser diode of the foregoing embodiment, to reduce its size to one millimeter square (a size excluding the flexible circuit 14), with the environmental resistance a superior as that of the laser diode of the can-seal type. Therefore, the size reduction of the laser diode may be advantageously achieved to a large extent.

It should also be noted here that in the foregoing embodiment, although the transparent resin 12 not only seals the laser diode chip 9, but even seals the solid state waveguide 12a, the arrangement may, for example, be so modified that the transparent resin covers only the surface of the laser diode chip 9 or only the front cleavage surface 9a depending on the necessity for design requirements.

It is needless to say that the present embodiment may also be applied to a laser diode of the can-seal type as well.

As described so far, the laser diode according to the present invention is characterized in that the front cleavage face of the laser diode chip is covered by the transparent resin, and therefore, there are such advantages that the front cleavage face is cut off from the atmosphere for the improvement of resistance against the environment and particularly, resistance against humidity. Moreover, in the unit type laser diode, a reduction in the size can be readily achieved.

Figure 4:
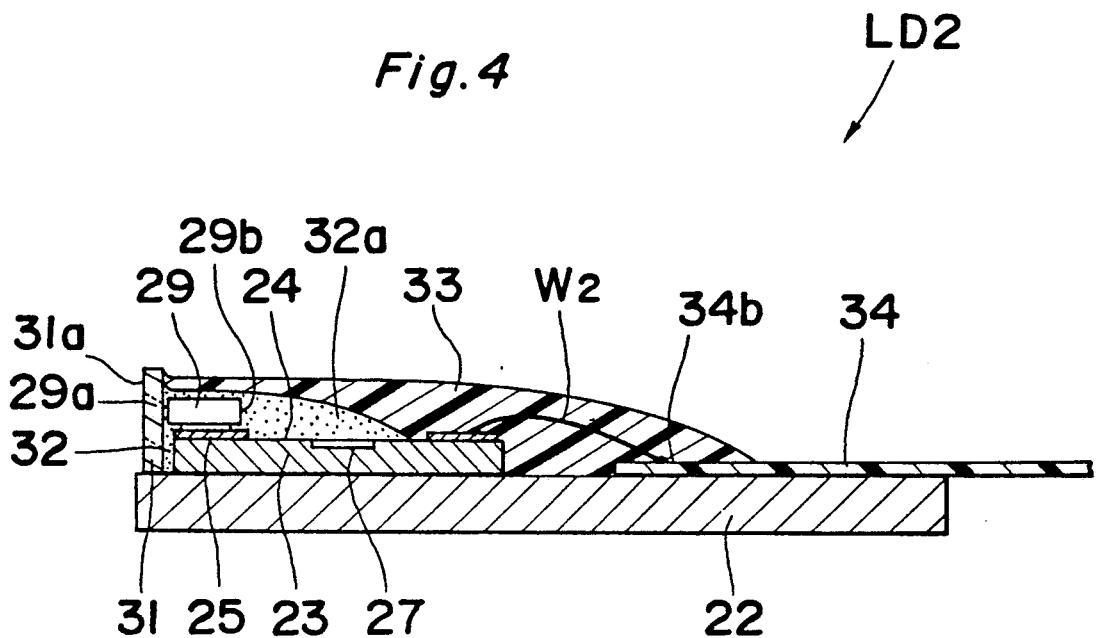
FIG. 4 is a side sectional view of a laser diode according to a second embodiment of the present invention.
Figure 5:
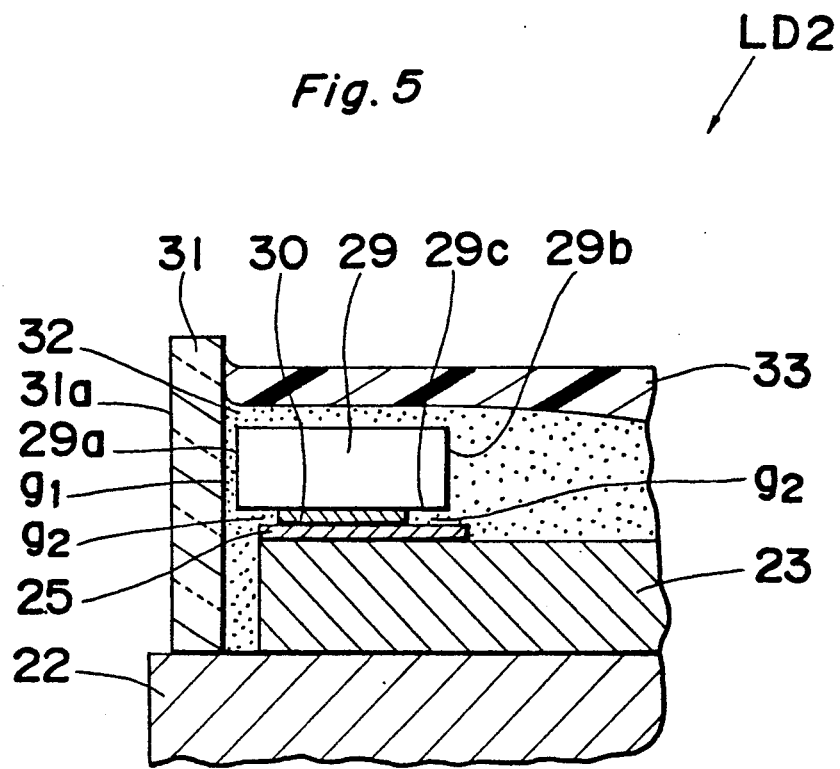
FIG. 5 is a fragmentary side sectional view showing on an enlarged scale, an essential portion of the laser diode of FIG. 4.
Figure 6:
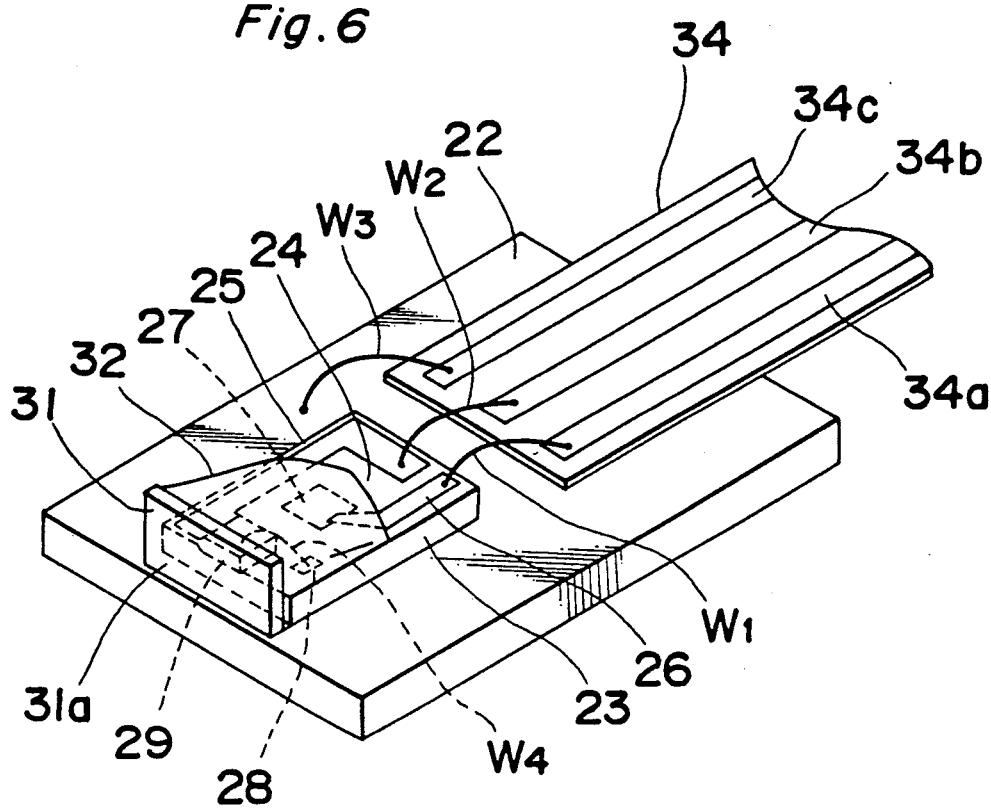
FIG. 6 is a perspective view of the laser diode in FIG. 4, with a protective resin thereof removed for clarity.

Referring further to FIGS. 4 to 6, a laser diode LD2 according to a second embodiment of the present invention will be described.

The laser diode LD2 is also of the so-called unit type, and similarly includes a substrate 22, a laser diode chip 29 bonded on the substrate 22, through a sub-mount 23, and a monitor element 27 formed on the sub-mount 23.

On the substrate 22 prepared by applying nickel plating and gold plating over the surface of an aluminum plate, the sub-mount 23 is fixed by indium or the like. The sub-mount 23 basically made of a rectangular plate material of silicon is formed with an aluminum wiring 25 for supplying power to the laser diode chip 29 and another aluminum wiring 26 for deriving electric current produced on the sub-mount 23 by the action of the monitor element 27 in the similar manner as in the first embodiment on its surface through a silicon dioxide film 24 provided over the surface of the sub-mount 23.

At the forward central portion on the said sub-mount 23, the aluminum wiring 25 extends to form a bonding surface, on which the laser diode chip 29 is bonded by an electrically conductive brazing material 30, with the two cleavage faces 29a and 29b of the laser diode chip 29 being respectively directed towards the front and rear sides of the sub-mount 23.

In the above case, the electrically conductive brazing material 30 does not cause the entire bottom face 29c of the laser diode chip 29 to fixedly adhere to the bonding surface, but is adapted to leave gaps g2 (FIG. 5).

At the central portion on the surface of the sub-mount 23, i.e. at a region adjacent to the rear cleavage face 29b, the photo-diode element, which functions as the monitor element 27, is similarly formed by a PN junction through diffusion of the P type impurity from the surface of the sub-mount 23. The monitor element 27 is associated with the aluminum wiring 26.

The aluminum wirings 25 and 26 are respectively bonded to the corresponding leads 34a and 34b on the flexible circuit 34 by wires W1 and W2, while the negative electrode of the laser diode chip 29 is bonded by a wire W4, to the pad 28 conducted inside by partly cutting open the silicon dioxide film 24 on the sub-mount 23, and is thus electrically conducted to the substrate 22. The substrate 22 is further bonded to the lead 34c of the flexible circuit 34 by a wire W3.

So far, the construction of the laser diode LD2 for the second embodiment is generally similar to that of the laser diode LD1 described earlier with reference to FIGS. 1 to 3.

In the laser diode LD2 in FIGS. 4 to 6, a transparent plate 31 made of glass or plastic material is placed on the substrate 22 in a position at the forward edge thereof, and a transparent resin material 32 is filled between the transparent plate 31 and the front cleavage face 29a. The transparent resin material 32 further spreads towards the rear side of the laser diode chip 29, for connecting a solid state waveguide 32a to the rear cleavage face 29b and the monitor element 27 (FIG. 4).

For the transparent resin material 32, epoxy resin, silicon resin, etc. is employed by being dripped in a liquid state, with the transparent plate 31 being disposed in front of the laser diode chip 29. This resin material fills a gap g1 between the transparent plate 31 and the front cleavage face 29a, and also fills the gaps g2 between the bottom face 29c of the laser diode chip 29 and the upper face of the sub-mount 23 through the capillary action. After the gap g1 has been filled by the resin material, the transparent plate 31 is held by a surface tension of the resin material. When the resin material has been hardened under the above state, the entire laser diode chip 29 is sealed by the resin material 32.

On the substrate 22, a protective resin layer 33 is further formed so as to cover the sub-mount 23, wires W1 to W3, etc. as shown. Therefore, the laser diode LD2 may be handled as it is by holding thereof between fingers, tweezers, etc.

In the laser diode LD2 as described so far, the laser beam emitted from the front cleavage face 29a is projected forward from a flat front face 31a of the transparent plate 31 by transmitting through the transparent resin 32 and the transparent plate 31. Accordingly, the beam characteristics, etc. of the laser beam may be improved as compared with the case where the laser beam is projected directly from the front cleavage face 29a. In the above case, if an AR coating or the like is applied over the transparent plate 31 for prevention of reflection, a still better result may be achieved.

The laser beam emitted from the rear cleavage face 29b proceeds through the solid state waveguide 32a and is reflected at the boundary face between the transparent resin material 32 and the protective resin 33 so as to be received by the monitor element 7. It is to be noted here that if the protective resin 33 is prepared by dispersing a white pigment, titanium oxide or the like in a transparent resin material, the light transmitted out of the solid state waveguide 32a is subjected to scattering reflection, and again returns into the solid state waveguide 32a to be received by the monitor element 27 for further increasing the received light amount thereof.

Meanwhile, because the laser diode chip 29 is sealed by the transparent plate 31 and the transparent resin 32, the laser diode chip 29 is cut off from the atmosphere. Thus, variation in the state on the cleavage surfaces 29a and 29b and the bottom face 29c by the atmosphere, especially by humidity can be advantageously prevented. Accordingly, it is possible to impart a superior resistance against environment, which is not inferior to the resistance of the can-seal type laser diode, to the unit type laser diode.

In the conventional laser diode of the can-seal type, a diameter of about 5.6 mm is required at a minimum. However, in the laser diode LD2 of the second embodiment, the diameter may be reduced down to one millimeter square (excluding the flexible circuit 34) as was also referred to in the first the embodiment, with the resistance to environment not inferior to the can-seal type. Thus, miniaturization of the laser diode to a large extent comes possible.

Figure 7:
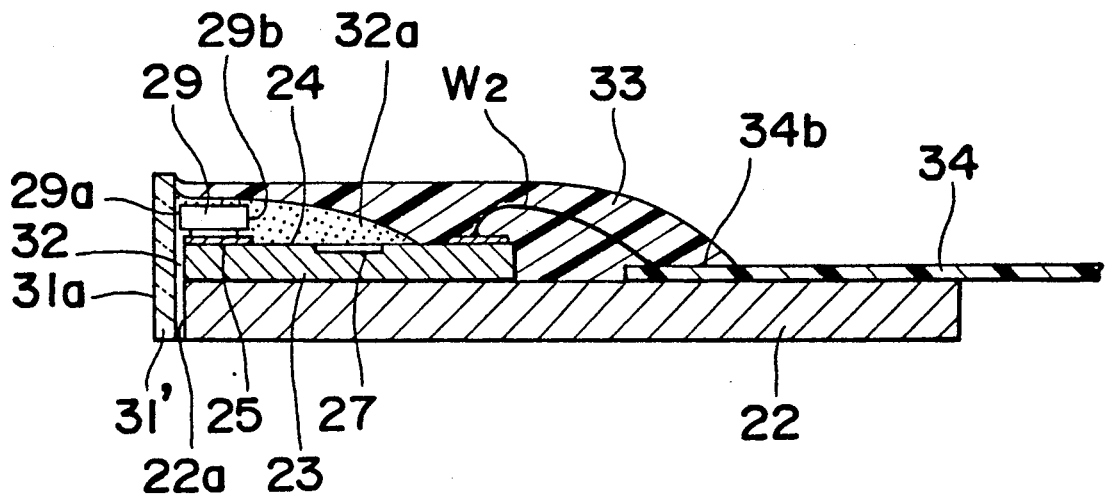
FIG. 7 is a view similar to FIG. 4, which particularly shows a modification thereof.
Figure 8:
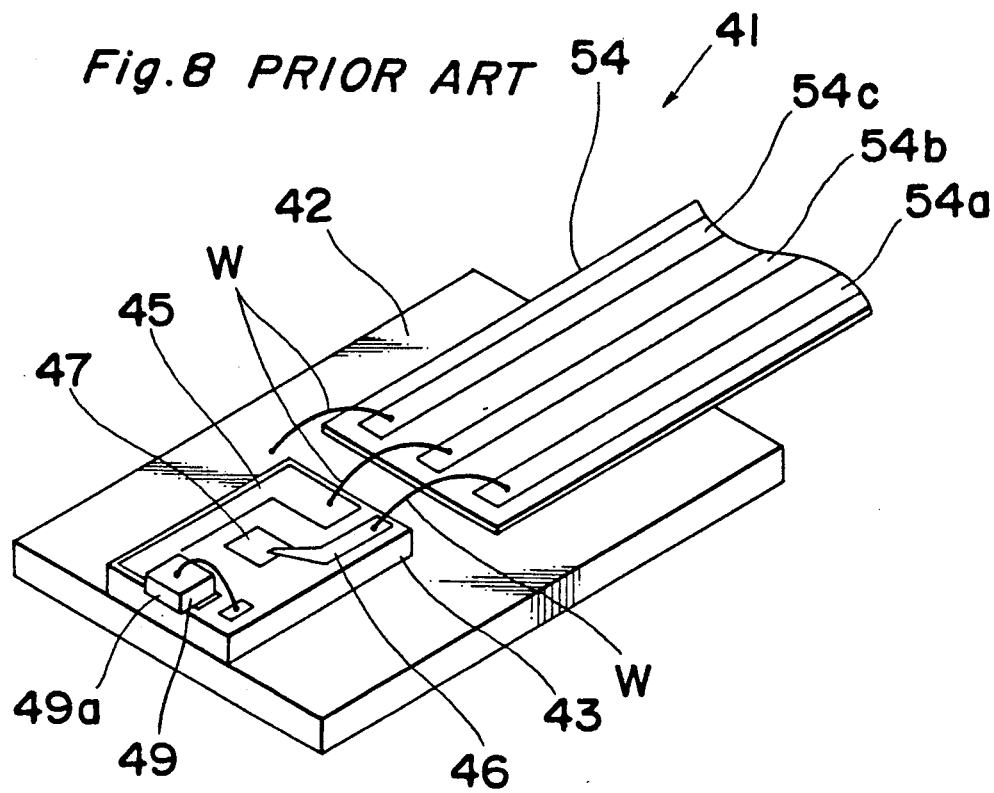
FIG. 8 is a perspective view showing the construction of a conventional laser diode (already referred to)
Figure 9:
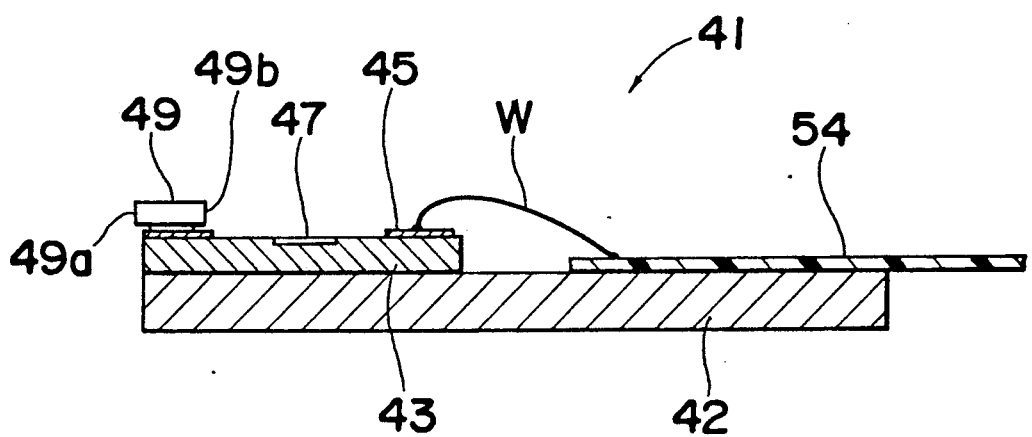
FIG. 9 is a side sectional view of the conventional laser diode of FIG. 8 (already referred to).

In a modified laser diode LD3 as shown in FIG. 7, the transparent plate 31 in the laser diode LD2 in the foregoing embodiment has been replaced by a transparent plate 31' arranged to also cover, a front edge face 22a of the substrate 22. Since all of the other construction and functions of the modified laser diode LD3 are generally similar to those of the laser diode LD2 of the second embodiment, a detailed description thereof is abbreviated here for brevity of explanation, with like parts being designated by like reference numerals.

It is to be noted here that in the foregoing embodiments, although the transparent resin material 32 is adapted not only to seal the laser diode chip 29, but also to form the solid state waveguide 32a, the arrangement may be, for example, so modified that the transparent resin is filled only in the gap g1 between the transparent plate 31 and the front cleavage face 29a depending on necessity.

It should also be noted that the concept of the present invention may also be applied to a laser diode of the can-seal type for flattening the laser beam emitting face.

As is clear from the foregoing description, according to the laser diodes LD2 and LD3, because the transparent member is disposed before the front cleavage face of the diode chip, with the transparent resin material being filled between the front cleavage face and the transparent plate, the laser beam emitting face becomes flat for the improvement of beam characteristics of the laser beam. Moreover, by cutting off the front cleavage face from the atmosphere, resistance to the environment, especially resistance against humidity can be improved. Furthermore, particularly in the laser diode of the unit type, miniaturization thereof to a large extent becomes possible.

Although the present invention has been fully described by way of example with reference to the accompanying drawings, it is to be noted here that various changes and modifications will be apparent to those skilled in the art. Therefore, unless such changes and modifications depart from the scope of the present invention, they should be construed as included therein.

What is claimed is:

1. A laser diode system comprising:
   a substrate;
   a sub-mount disposed on a portion of said substrate;
   a laser diode chip bonded on said sub-mount; and
   a monitor element formed on said sub-mount so as to monitor laser light emitted from a rear cleavage face of said laser diode chip, said laser diode chip being covered by a transparent resin layer having resistance against humidity to form solid state waveguide means connecting said rear cleavage face and said monitor element and a protective layer covering said solid state waveguide means for directing laser light emitted from said rear cleavage face to said monitor element.

2. A laser diode system as claimed in claim 1, wherein said transparent resin layer comprises an epoxy or silicon resin said protective layer is formed of a transparent resin comprising a white pigment or titanium oxide dispersed therein.

3. A laser diode system comprising:
   a substrate;
   a sub-mount disposed on a portion of said substrate;
   a laser diode chip bonded on said sub-mount;
   a monitor element formed on said sub-mount so as to monitor laser light emitted from a rear cleavage face of said laser diode chip;
   a transparent member disposed before a front cleavage face of said laser diode chip;
   a transparent resin layer having resistance against humidity being filed in a space between said front cleavage face and said transparent member and covering said laser diode chip to form solid state waveguide means connecting said rear cleavage face and said monitor element; and
   a protective layer covering said solid state waveguide means for directing laser light emitted from said rear cleavage fact to said monitor element.

4. A laser diode system as claimed in claim 3, wherein said transparent member is arranged to also cover a front face of said substrate.

* * * * *